US008866484B2

(12) United States Patent
Driehorn et al.

(10) Patent No.: US 8,866,484 B2
(45) Date of Patent: Oct. 21, 2014

(54) METHOD FOR TESTING THE FUNCTIONALITY OF THE ELECTROMAGNETIC TRIPPING OF A SWITCH, IN PARTICULAR OF A CIRCUITBREAKER FOR LOW VOLTAGES

(75) Inventors: Thomas Driehorn, Berlin (DE); Gerd Müller, Falkensee (DE)

(73) Assignee: Siemens Aktiengesellschaft, Munich (DE)

( * ) Notice: Subject to any disclaimer, the term of this patent is extended or adjusted under 35 U.S.C. 154(b) by 109 days.

(21) Appl. No.: 13/239,458

(22) Filed: Sep. 22, 2011

(65) Prior Publication Data

US 2012/0074948 A1  Mar. 29, 2012

(30) Foreign Application Priority Data

Sep. 27, 2010  (DE) .......................... 10 2010 041 449

(51) Int. Cl.
*G01R 31/02* (2006.01)
*G01R 31/327* (2006.01)
*H01H 47/00* (2006.01)

(52) U.S. Cl.
CPC ...... *G01R 31/3277* (2013.01); *H01H 2047/008* (2013.01); *H01N 47/002* (2013.01)
USPC ........................................................ 324/415

(58) Field of Classification Search
USPC ............. 324/412, 76.11, 500, 415–424, 463, 324/200, 205, 207.21, 210–263, 750.12, 324/750.21, 754.17, 754.29, 160–179; 361/42, 104, 45, 48
See application file for complete search history.

(56) References Cited

U.S. PATENT DOCUMENTS

| 4,870,364 | A | 9/1989 | Trox et al. |
| 5,539,608 | A | 7/1996 | Hurley et al. |
| 5,777,536 | A | 7/1998 | Lee et al. |
| 6,225,807 | B1 | 5/2001 | Pohl |
| 2009/0243615 | A1* | 10/2009 | Kuehn .......................... 324/326 |

(Continued)

FOREIGN PATENT DOCUMENTS

| DE | 3715591 A1 | 11/1988 |
| DE | 4126534 A1 | 2/1993 |

(Continued)

OTHER PUBLICATIONS

Office Action for corresponding Chinese patent application No. 201110286923.4 dated Oct. 17, 2013 with English translation.

(Continued)

*Primary Examiner* — Melissa Koval
*Assistant Examiner* — Trung Nguyen
(74) *Attorney, Agent, or Firm* — Harness, Dickey & Pierce, P.L.C.

(57) ABSTRACT

A method is disclosed for testing the functionality of the electromagnetic tripping of a switch, in particular of a circuit breaker for low voltages, which has switching contacts which are opened with the aid of a tripping shaft, which is held prestressed by a switching mechanism and is unlatched by a tripping magnet which for this purpose has a winding through which a current is sent for tripping. In order to test the functionality with relatively little effort, it is proposed in at least one embodiment that the winding is connected as an inductance in a resonant circuit, the resonant frequency of the resonant circuit is detected, and the functionality of the tripping magnet is assessed on the basis of the detected resonant frequency.

11 Claims, 1 Drawing Sheet

(56) References Cited

U.S. PATENT DOCUMENTS

2010/0164659 A1* 7/2010 Ohtsuka et al. .............. 335/174
2012/0218676 A1* 8/2012 Demetriades et al. ........ 361/115

FOREIGN PATENT DOCUMENTS

| DE | 4406250 | A1 | 9/1994 |
| DE | 19603319 | A1 | 8/1997 |
| JP | H06-501779 | | 2/1994 |

OTHER PUBLICATIONS

Geman priority application 10 2010 041 449.2 filed Sep. 27, 2010 (not yet published).

* cited by examiner

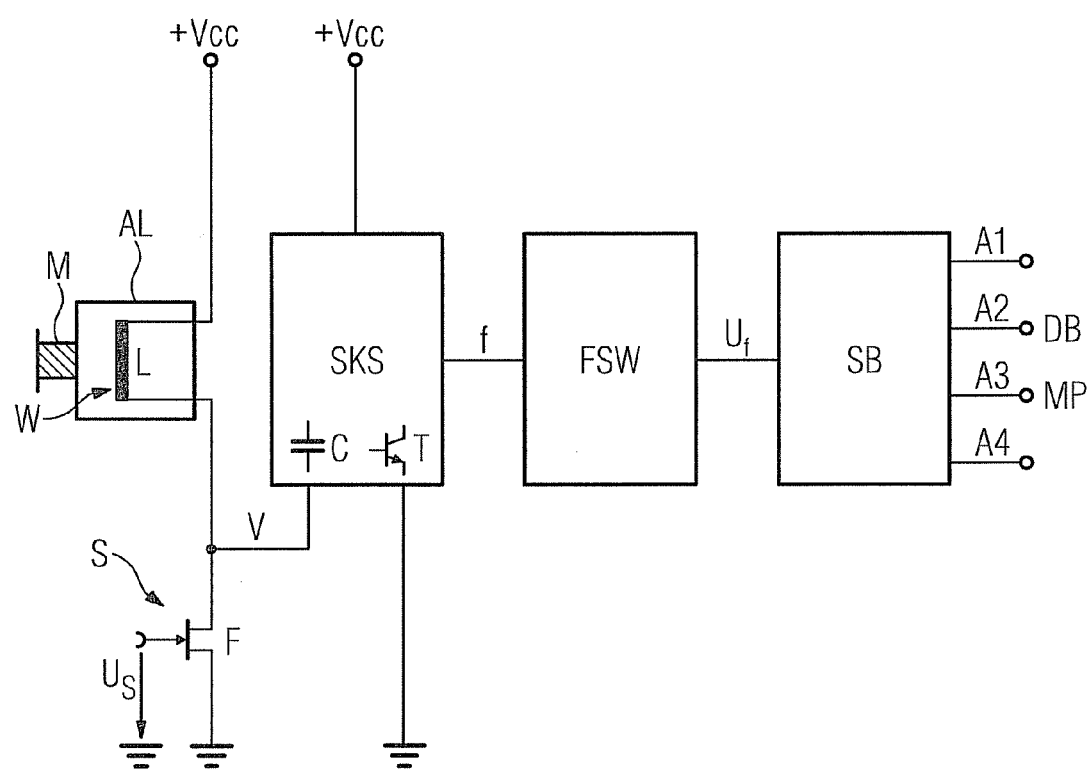

METHOD FOR TESTING THE FUNCTIONALITY OF THE ELECTROMAGNETIC TRIPPING OF A SWITCH, IN PARTICULAR OF A CIRCUITBREAKER FOR LOW VOLTAGES

PRIORITY STATEMENT

The present application hereby claims priority under 35 U.S.C. §119 on German patent application number DE 10 2010 041 449.2 filed Sep. 27, 2010, the entire contents of which are hereby incorporated herein by reference.

FIELD

At least one embodiment of the invention generally relates to a method for testing the functionality of the electromagnetic tripping of a switch, in particular on a circuit breaker for low voltages.

BACKGROUND

Circuit breakers for low voltages are known and are used as protection switches in installations for electrical power distribution. A conductor runs through the switch for each current phase, and an alternating current flows through each of these conductors. When the switch is closed, contact elements of the switch make contact with one another. A current transformer is in each case arranged directly on the conductor of each current phase in the switch and emits an electrical signal, which is dependent on the current flowing and is evaluated. The current detected in this way is compared by an overcurrent release (tripping unit) with a current limit value, and the overcurrent release trips the switch if this current limit value is exceeded. Tripping occurs in particular when a long-lasting overcurrent or short-circuit current occurs. The current limit value is dependent on parameters and characteristics.

In order to open the switch, the switching contacts are opened with the aid of a tripping shaft, which is held prestressed by a switching mechanism. The switching mechanism is unlatched by a tripping magnet (electromagnet), which has a winding through which a current is sent in the event of tripping. Unlatching the switching mechanism releases the mechanical energy which is stored in a spring energy store. The stored energy is released by a tripping magnet with relatively little force. The tripping magnet is operated by the overcurrent release, and the switching mechanism is unlatched by means of the movable tripping magnet (plunger).

The operation of the switch is therefore directly dependent on the operation of the tripping magnet. Failure of the tripping magnet to operate because of a broken wire or mechanical blocking may have serious consequences.

SUMMARY

In at least one embodiment of the invention, the functionality of the tripping magnet is tested with relatively little effort.

The dependent claims represent advantageous refinements.

At least one embodiment provides that a winding is connected as an inductance power in a resonant circuit, the resonant frequency of the resonant circuit is detected, and the functionality of the tripping magnet is assessed on the basis of the detected resonant frequency. At least one embodiment of the invention solves the testing of the functionality of the electromagnetic tripping in that the inductance of the tripping magnet forms a resonant circuit, by way of specific external circuitry, the resonant frequency of which resonant circuit is governed primarily by the inductance of the tripping magnet. A change in the inductance when the tripping magnet is retracted or extended or in the event of a partial winding short in each case results in a change in the resonant frequency of the resonant circuit. If a wire in the winding (solenoid coil) is broken, this leads to the resonant circuit collapsing, and to the oscillations discontinuing.

BRIEF DESCRIPTION OF THE DRAWINGS

Embodiments of the invention will be described in more detail in the following text with reference to the drawing, whose single FIGURE shows a schematic illustration of a test circuit for a circuit breaker for low voltages.

DETAILED DESCRIPTION OF THE EXAMPLE EMBODIMENTS

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The FIGURE illustrates only a tripping magnet M of the switch, which tripping magnet M comprises a winding W (solenoid coil) and forms an inductance L. A conductor runs through the switch (for each current phase in the case of a multipole switch), and an alternating current flows through this conductor. When the switch is closed, contact elements of the switch make contact with one another. A current transformer is arranged immediately adjacent to the conductor and outputs an electrical signal which is dependent on the current flowing and is evaluated. The current detected in this way is compared by an overcurrent release AL (a tripping unit) with a respective predetermined current limit value and, if the current limit value is exceeded, the switch is tripped by the overcurrent release AL. In particular, tripping occurs in the event of an overcurrent and a short-circuit current. The current limit value is dependent on parameters and characteristics; the switch is tripped and opened in the event of a long-lasting overload or short circuit.

In order to open the switch the switching contacts are opened with the aid of a tripping shaft, which is kept prestressed by a switching mechanism. In the event of tripping, the switching mechanism is unlatched by means of a tripping magnet M (electromagnet), through whose winding W a current is sent, in that the overcurrent release AL passes a fault signal, in this case a voltage Us, to an electronic switching element S, in this case an FET F, which is thus switched on. Unlatching the switching mechanism releases the mechanical energy which is stored in a spring energy store.

Without the voltage Us, the inductance L which is connected to the supply voltage Vcc is in each case isolated from ground.

A resonant circuitry SKS is used to connect a capacitor C to the inductance L (via the connection V and the supply voltage Vcc), and these together form a resonant circuit. The resonant circuitry SKS ensures that the resonant circuit is continuously energized. This is illustrated schematically in the FIGURE by the transistor T. The resonant circuit has a resonant frequency (natural frequency), which is in this case converted to a voltage Uf by way of a frequency-voltage converter FFW. The voltage Uf is passed to a signal assessment circuit SB, which outputs a fault signal on the basis of the discrepancy from a predetermined voltage value. As the FIGURE shows, the signal assessment SB in this case has four outputs A1, A2, A3, A4, which each output the fault signal for a different fault. For example, a fault signal at the output A2 indicates that there is a broken wire DB in the winding W of the tripping magnet M. The output A3 in turn produces a fault signal if the tripping magnet M has not assumed its tripping position.

At least one embodiment provides that a winding is connected as an inductance power in a resonant circuit, the resonant frequency of the resonant circuit is detected, and the functionality of the tripping magnet is assessed on the basis of the detected resonant frequency. At least one embodiment of the invention solves the testing of the functionality of the electromagnetic tripping in that the inductance of the tripping magnet forms a resonant circuit, by way of specific external circuitry, the resonant frequency of which resonant circuit is governed primarily by the inductance of the tripping magnet. A change in the inductance when the tripping magnet is retracted or extended or in the event of a partial winding short in each case results in a change in the resonant frequency of the resonant circuit. If a wire in the winding (solenoid coil) is broken, this leads to the resonant circuit collapsing, and to the oscillations discontinuing.

Evaluation of the signal produced by the resonant circuit therefore makes it possible to produce a statement relating to:
a) the position of the tripping magnet (retracted or extended) and
b) a possible broken wire or deterioration in the electrical characteristics of the tripping magnet.

It is therefore possible to monitor both the possible readiness (lack of a broken wire) and the success of a tripping attempt (verification of the state change/position change after an operating attempt).

Expediently, a fault signal is output in the absence of a resonant frequency.

Advantageously, the operating state (the position) of the tripping magnet is detected on the basis of the resonant frequency.

This is technically simple if the frequency is converted to a voltage by means of a frequency/voltage conversion, and the converted voltage is assessed. The oscillations produced by the resonant circuit can be evaluated by direct or indirect frequency measurement. For direct frequency measurement, the signal must be supplied to a suitable counting apparatus, and must be evaluated over time. In the case of indirect frequency measurement, it is sufficient for the signal to be converted by further electronic circuitry to a specific-frequency voltage or current signal, and for this to be evaluated.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or the drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

What is claimed is:

1. A method for assessing functionality of an electromagnetic tripping of a switch including switching contacts which are openable with the aid of a tripping shaft, the tripping shaft being held prestressed by a switching mechanism and being unlatchable by a tripping magnet which includes a winding through which a current is sent for tripping, the method comprising:

connecting the winding as an inductance in a resonant circuit;
energizing the resonant circuit continuously;
detecting the frequency of oscillations produced by the resonant circuit;
assessing the functionality of the tripping magnet, based upon the detected frequency; and
outputting a result of the assessment via a plurality of outputs, wherein a first fault signal is output at a first output indicating a broken wire in the winding of the tripping magnet and wherein a second fault signal is output via a second output if the tripping magnet has not assumed a tripping position.

2. The method as claimed in claim 1, further comprising:
outputting a fault signal upon failing to detect the resonant frequency.

3. The method as claimed in claim 1, wherein an operating state of the tripping magnet is detected on the basis of the detected resonant frequency.

4. The method as claimed in claim 1, wherein the detected frequency is converted to a voltage by way of a frequency-voltage conversion, and wherein the converted voltage is assessed.

5. The method as claimed in claim 1, wherein the method is for testing functionality of an electromagnetic tripping of a circuit breaker for low voltages.

6. The method as claimed in claim 2, wherein an operating state of the tripping magnet is detected on the basis of the detected frequency.

7. The method as claimed in claim 2, wherein the detected frequency is converted to a voltage by way of a frequency-voltage conversion, and wherein the converted voltage is assessed.

8. The method as claimed in claim 3, wherein the detected frequency is converted to a voltage by way of a frequency-voltage conversion, and wherein the converted voltage is assessed.

9. The method as claimed in claim 6, wherein the detected frequency is converted to a voltage by way of a frequency-voltage conversion, and wherein the converted voltage is assessed.

10. The method as claimed in claim 1, wherein the resonant circuit is an oscillator circuit.

11. The method as claimed in claim 1, further comprising connecting the resonant circuit to the inductance via a capacitor.

* * * * *